United States Patent
Agrawal et al.

(10) Patent No.: US 7,254,791 B1
(45) Date of Patent: Aug. 7, 2007

(54) METHOD OF MEASURING TEST COVERAGE OF BACKEND VERIFICATION RUNSETS AND AUTOMATICALLY IDENTIFYING WAYS TO IMPROVE THE TEST SUITE

(75) Inventors: Himanshu Agrawal, Bangalore (IN); Partha Ray, Bangalore (IN); Tathagato Rai Dastidar, Bangalore (IN)

(73) Assignee: National Semiconductor Corporation, Santa Clara, CA (US)

( * ) Notice: Subject to any disclaimer, the term of this patent is extended or adjusted under 35 U.S.C. 154(b) by 168 days.

(21) Appl. No.: 11/229,085

(22) Filed: Sep. 16, 2005

(51) Int. Cl.
*G06F 17/50* (2006.01)

(52) U.S. Cl. .............................. 716/4; 716/5
(58) Field of Classification Search .............. 716/4, 716/5

See application file for complete search history.

(56) References Cited

U.S. PATENT DOCUMENTS

| | | | |
|---|---|---|---|
| 6,324,678 B1 * | 11/2001 | Dangelo et al. | 716/18 |
| 6,526,546 B1 * | 2/2003 | Rolland et al. | 716/4 |
| 6,606,735 B1 * | 8/2003 | Richardson et al. | 716/5 |
| 6,611,946 B1 * | 8/2003 | Richardson et al. | 716/5 |

* cited by examiner

*Primary Examiner*—Paul Dinh
*Assistant Examiner*—Suchin Parihar
(74) *Attorney, Agent, or Firm*—Stallman & Pollock LLP

(57) ABSTRACT

The quality assurance of all released runset files should ideally be 100% complete to ensure the best quality of the runsets. This means that the designs used for testing should be sufficient to test all of the design rules with the appropriate data in the runset to reach 100% coverage, which is not easy to ensure. The present invention provides a methodology that addresses this problem by quantitatively measuring the test coverage of backend verification runsets. The methodology not only reports the uncovered rules, but also assists the quality assurance engineers in locating reasons as to why those rules are not covered and how coverage can be improved by designing appropriate test cases.

2 Claims, 4 Drawing Sheets

METHOD OF MEASURING TEST COVERAGE OF BACKEND VERIFICATION RUNSETS AND AUTOMATICALLY IDENTIFYING WAYS TO IMPROVE THE TEST SUITE

TECHNICAL FIELD

The present invention relates to the design and manufacture of integrated circuit (IC) devices and, in particular, to quality assurance (QA) for IC designs.

LIST OF ACRONYMS AND DEFINITIONS

The following acronyms and definitions are used in this document:

TCA (Test Coverage Analyzer)—a software tool that uses the methodology of the present invention.

DRC (Design Rule Check)—used to verify if an original layout database, typically represented in GDSII format, complies with the design rules specified for the targeted fabrication process.

LVS (Layout Versus Schematic)—compares the original layout with the schematic netlist to determine if the physical description of the circuit correctly reflects the logic implemented in the schematic netlist.

DP (Design Package)—the collection of design collateral that includes various runset files, libraries, models, symbols, flows, etc. and that are used to design integrated circuits.

QA (Quality Assurance)

Layer—a symbolic name assigned to the data used in a physical design; in other words, a layer can be considered a container for data.

Primary and Derived Layers—the original physical design input layer that is present in the GDSII database is referred to herein as the "primary layer"—any layer that is created with the help of different data creation commands of backend verification tools to test the design against specific foundry requirements is referred herein as a "derived layer"—therefore, a derived layer can be created directly from primary layers, from derived layers or from a mix of primary layers and derived layers.

Empty Layer—a layer that does not have any data associated with it.

DESCRIPTION OF THE INVENTION

The designs of integrated circuits that are used in electronic devices such as computers, mobile phones, etc. need to be thoroughly verified before they are fabricated in order to reduce the cost of production. Backend verification software tools take care of this requirement.

Backend verification of IC design is carried out by two methods. The Design Rule Check (DRC) method is commonly used to verify if the layout of the circuit complies with the design rules specified for the targeted fabrication process. The Layout Versus Schematic (LVS) technique is used to compare the layout of the circuit with its schematic description to determine of the layout correctly reflects the logic implemented in the schematic netlist. A text file called runset file contains design rules that are used by backend verification software to carry out the DRC and LVS checks.

Thus, in the progression of integrated circuit (IC) design, design packages are typically generated that include, among other things, runsets for the backend verification software tools, such as, for example the Hercules® Hierarchical Design Verification tool available from Synopsis Inc. and the Assura DRC tool available from Cadence.

Figure 1:
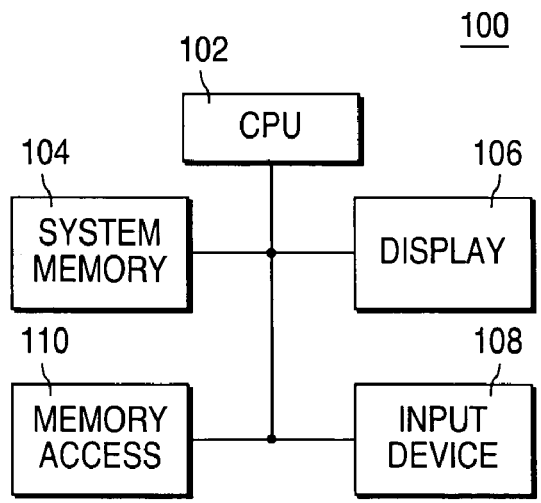
FIG. 1 is a block diagram illustrating a conventional data processing system.

FIG. 1 shows a well-known general architecture of a data processing system 100 that can be utilized to execute a program implementation of backend verification tool. The data processing system 100 includes a central processing unit (CPU) 102 and a system memory 104 that is connected to the CPU 102. The system memory 104 typically stores the operating system for the CPU 102 as well as data and various sets of program instructions for applications to be executed by the system 100. For example, the system memory 104 could store a software program, i.e., a sequence of machine-readable program instructions needed to implement a method for measuring test coverage of backend verification runsets and for automatically identifying ways to improve the test suite in accordance with the concepts of the present invention. Typically, the computer system 100 also includes a display 106 that is connected to the CPU 102 to allow images to be visually displayed to a user, a user input system 108, e.g., a keyboard or mouse, that allows the user to interact with the system 100, and a memory access system 110 that enables transfer of data both within the system 100 and between the system 100 and systems external to the system 100, e.g., a computer network to which the system 100 is connected. All of these components and the ways in which they interact are well known to person skilled in the art.

One of the most basic requirements is that the runsets mentioned above should meet the highest quality standards. Meeting the best quality standards ensures less cycle time and improves the chance of achieving first-time functioning silicon for the IC design, one of the major goals of IC manufacturers. In order to ensure the quality of these runset files, extensive QA is carried out before they are released.

A major problem that is commonly faced by QA groups is how to ensure complete testing of these runset files. This is not possible unless there is a thorough methodology along with software that automates that methodology to quantitatively measure the completeness of testing. Such a methodology and the software should also be capable of identifying potential lacunae in the test-suite used in the QA and should help the QA engineers in upgrading the test-suite for better coverage. It is, therefore, viewed as an important challenge.

A methodology in accordance with the concepts of the present invention addresses the above problem by quantitatively measuring the test-coverage of backend verification runsets. The tool not only reports the uncovered rules of the runset, but also helps the test engineers to locate the reasons as to why those rules are not covered and how the coverage can be improved by designing appropriate test cases. QA of all the runsets should ideally be 100% complete. This means that the designs used should be sufficient to apply all the rules in the runset with appropriate data to get a 100% testing of the rules. The test-suite should also execute all the lines in the runset files in order to achieve 100% line coverage. As mentioned above, the problem is finding a methodology to quantitatively measure the coverage and to report the uncovered rules and the reasons for the lack of coverage. The algorithms, and hence the tool, should be capable of suggesting what needs to be done in order to upgrade the test suite to achieve 100% coverage. The same argument holds for layout-versus-schematic (LVS) runsets as well. The test-suite should be able to extract all the devices that are defined through various device extraction commands in a LVS runset.

Conventional tools like the above-mentioned Hercules and Assura products produce separate output reports for each test design. A test coverage analyzer (TCA) in accordance with the present invention takes these report files, along with the runset file that is being tested, as inputs. It reads the runset file to record the rules and the conditions under which these rules are applicable. It also reads the report files produced by the Hercules/Assura tool to record the rules that have been executed and the conditions that were applied. The TCA of the present invention analyzes this information to produce a coverage report that also suggests how the test suite can be improved. It is noted that the TCA method of the present invention, described in detail below in the context of examples, does not require any detailed semantic analysis of the runsets.

Typically, a verification runset for DRC and LVS for a particular fabrication process begins with a section that defines various input layers that are present in the layout database. These layers are referred to as "primary layers" in this document. This is followed by a sequence of data creation commands that derive additional layers. For example, MOSFET gate regions, well taps and substrate ties and bulks can be derived from the original physical layer information using different layer processing commands. Such layers are referred to as "derived layers" in this document. Derived layers are then used to perform necessary DRC checks and device extraction for LVS. The runsets also contain various switches and environment variables that control the flow of execution. Usually, the runset files contain a set of environment variables that define the flow to control in different parts of the runset and it is difficult to locate such dependencies in the runset manually.

For example, let us look at the following snippet of a Hercules DRC runset file for a 0.18 micron process:

```
/* List of switches and environment variables */
ENVIRONMENT STRING METAL_LAYERS DEFAULTS TO "4LM"
/*4LM 5LM 6LM*/
ENVIRONMENT STRING uSMD_RULE DEFAULTE TO "TURE"
/* TRUE FALSE */
ENVIRONMENT STRING CIRCUITRY    DEFAULTS TO "EPI";
/* EPI NON-EPI */
...
...
/* Layer Definition section (primary Layers) */
ASSIGN {NWELL (1;0)}
ASSIGN {HNWELL (2;0)}
ASSIGN {GOX(3;1)}
ASSIGN {RWELDEF (4;0)}
ASSIGN {DRCNOT (5;0)}
...
...
/* Data Creation Commands */
BOOLEAN NWELL AND GOX { } TEMP= NWELL_inside_GOX
BOOLEAN NWELL NOT NWELL_inside_GOX { } TEMP=NWELL
SELECT NWELL INTERACT RWELDEF { } EMP=nwres
```

-continued

```
BOOLEAN NWELL NOT nwres { } TEMP=cnwel
BOOLEAN nwres NOT DRCNOT { } TEMP=nwres
BOOLEAN cnwel NOT pwrwell { } TEMP=xpwrwel
...
...
/* Rule 10.010 – NWELL width <3.0*/
INTERNAL nwel {
    COMMENT = "10.010 NWELL width <3.0"
    SPACING<3.000
    NON_PARALLEL=TRUE} (1;0)
If {METAL_LAYERS == 4Lm {
/* Rule 10.015 – NWELL width not connected to VDD <6.0*/
BOOLEAN xpwrwel NOT DRCNOT { } TEMP = xpwrwel
INTERNAL xpwrwel {
    COMMENT = "10.015A NWELL width not connected to VDD
    <6.0"
    SPACING<6.000
    NON_PARALLEL=TRUE} (1;1)
}
...
...
/* Device Extraction Command */
NMOS MND_dev bngate bndiff bndiff psub {
    EV_SOURCE_PERIM = EV_SPERIM;
    EV_DRAIN_PERIM = EV_DPERIM;
    MOS_REFERENCE_LAYER="POLY1";
    EV_WIDTH = (EV_W1+EV_W2)/2.0;
    EV_LENGTH = EV_GAREA/EV_WIDTH;
    mos_multiterm_extract=TRUE;} TEMP=_generated_output_layer
/* end of runset file */
```

In the above example, the runset file begins with a list of all the switches and environment variables like "METAL_LAYERS", "uSMD_RULE" etc. The values of these switches are set by the user which define the flow of execution. The layers HNWELL, NWELL, GOX, RWELDEF etc. defined through the "ASSIGN" command in the next section are the primary layers. These original layers are used to create several derived layers that are then used as input to various DRC rules. These derived layers are also used to extract devices like the NMOS device "MND_dev" in the above example with the gate, source/drain and substrate defined by layers bngate, bndiff and psub, respectively.

A method in accordance with the present invention uses the output summary files generated by backend verification tools like Hercules and Assura for different test cases to determine the test coverage of runsets. These output files contain the sequence of statements and data creation commands that have been executed in a particular DRC or LVS run in the same order as they have been coded in the runset. It also contains the values of the environment variables and the switches that have been used in the execution. In addition, the summary files also contain the DRC rules and device extraction commands in LVS that have been executed along with the information on layers that are empty.

For example, consider the following Hercules output summary file corresponding to the snippet of the runset file mentioned above.

```
Hercules ® Hierarchical Design Verification, Release U-2003.03.0057 ©
Copyright 1996, 1997, 1998, 1999, 2000, 2001, 2002, 2003
Synopsys, Inc. All Rights reserved.
#ENVIRONMENT STRING METAL_LAYERS; /* "4LM" */
#ENVIRONMENT STRING CHECK_GENLAY_RULES;
/* "TRUE" */
#ENVIRONMENT STRING CIRCUITRY; /* "EPI" */
#ENVIRONMENT STRING uSMD_rule; /* "FALSE" */
#ENVIRONMENT STRING DATABASE; /* "GDSII" */
...
```

-continued

```
ASSIGN {NWELL (1;0)}
ASSIGN {HNWELL(2;0)}
ASSIGN {GOX (3;1)}
ASSIGN {RWDELDEF (4;0)}
ASSIGN {DRCNOT (5;0)}
ASSIGN {COMP (7;0)}
ASSIGN {POLY (6;0)}
ASSIGN {MET1 (8;0) text (37;1)}
...
...
BOOLEAN NWELL AND GOX { } TEMP=NWELL_inside_GOX
Input layer "NWELL" is empty.
Input layer "GOX" is empty.
No output written.
Layer "NWELL_inside_GOX" is empty.
    Check time =0:00:00 User=0.00 Sys=0.00 Mem=10.317
BOOLEAN NWELL NOT NWELL_inside_GOX { } TEMP=NWELL
Input layer "NWELL" is empty.
Input layer "NWELL_inside_GOX" is empty.
No output written.
Layer "NWELL" is empty.
    Check time =0:00:00 User=0.00 Sys=0.00 Mem=10.317
BOOLEAN COMP AND POLY { } TEMP=cmpoly
24 unique polygons written
check time =0:00:00 User=0.00 Sys=0.00 Mem=10.317
...
INTERNAL new {
COMMENT = "10.010 NWELL width <3.0"
SPACING<3.000
NON_PARALLEL=TRUE} (1;0)
Input layer "nwel" is empty.
0 width violations found.
    Check time = 0:00:00 User=0.00 Sys=0.01 Mem=11.986
INTERNAL xpwrwel {
COMMENT = "10.015A NWELL width not connected to VDD <6.0"
SPACING<6.000
NON_PARALLEL=TRUE} (1;1)
1 width violations found.
    Check time = 0:00:00 User=0.00 Sys=0.00 Mem=11.986
...
...
```

The summary file contents for a particular DRC run, as given above, are used to determine the coverage of the runsets. The sequence of data creation commands that have been executed is used to create a hierarchical directed layer graph for the DRC rules and the device extraction commands that have been executed. That is, a graph G=(V, E) is defined, where V is a set of vertices representing layers and E is the set of directed edges. Given the sequence of data creation commands and statements that appear in the output summary file, the layer graph is constructed as follows. All of the primary layers of the layout data that are defined in the runset form the initial vertices of the graph. Thus, the primary layer vertices do not have any "parents." Whenever a new derived layer is created from these primary layers using different data creation commands, a vertex is created representing the derived layer and directed edges are added from the primary layer (vertex) to the new derived layer (vertex). This "child" layer can be used to create another new derived layer in the later sequence of commands. As and when a new derived layer (vertex) is created, directed edges are added from its parent layers (vertices) to the newly created child layer (vertex). For every DRC rule or device extraction command that appears in the output summary file, such a layer graph is constructed, which is referred to as the "reference graph" for that rule (device). The reference graph for a rule, therefore, represents the order in which the rule check has been performed starting from the original layers of the test design until the input layers of the rule.

For example, consider the following sequence of statements below that is used to create a layer graph for DRC Rules R1 and R2.

```
/* Layer Definition Section */
ASSIGN {A (1;0)}
ASSIGN {B (2;0)}
ASSIGN {C (3;0)}
ASSIGN {D (4;0)}
/* Data Creation Commands */
BOOLEAN A and B { } TEMP=ab
BOOLEAN ab OR C { } TEMP=ab_c
BOOLEAN A NOT D { } TENP=a_not_d
BOOLEAN B NOT D { } TEMP=b_not_d
BOOLEAN C NOT D { } TEMP=c_not_d
SELECT D outside ab TEMP=d_o_ab
INTERNAL d_o_ab {
COMMENT = "Rule 1: A DRC rule"
}
Enclose d_o_ab BY ab_c{
COMMENT = "Rule 2: A DRC rule"
}
```

Figure 2:
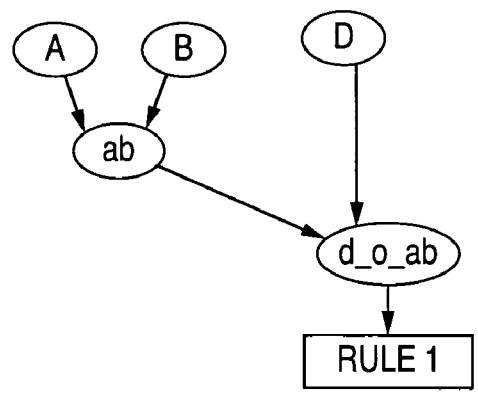
FIG. 2 is a directed layer graph for DRC Rule 1.

Using the sequence of the statements as given above, the directed layer graph representation (reference graph) for Rule 1 is shown in FIG. 2.

It can be seen that the primary layer "C" and derived layers "ab c", "a_not_d", and "c_not_d" do not appear in the FIG. 2 reference graph for Rule 1 because the data present in these layers are not used in that DRC rule. The input layer to this rule is represented by layer "d_o_ab". Primary layers "A", "B" and "D" are the only relevant primary layers that are used in DRC Rule 1.

Figure 3:
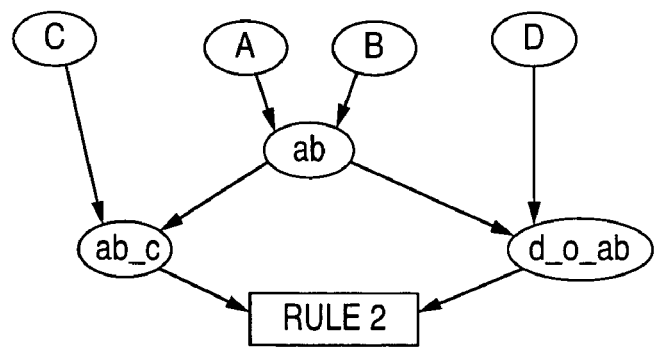
FIG. 3 is a directed layer graph for DRC Rule 2.

Similarly, FIG. 3 shows the layer graph representation for DRC Rule 2.

Such a directed layer graph (reference graph) is constructed for every DRC rule that starts from the relevant original layers and ends at the input layers of the rule. For a device extraction command, the layer graph starts from the original layers and ends at the terminal layers of the device. Each such graph is constructed for every rule that is executed in a particular DRC run. For rules that have not been executed, there is no corresponding graph.

The first and the foremost step for coverage analysis is to identify all of the actual DRC rules and device extraction commands that extract different devices. Every DRC rule has a description that defines the purpose of the rule.

For example, in a Hercules runset, every DRC rule has a COMMENT section that describes the purpose of the rule. Similarly, there are device extraction commands for Hercules, such as NMOS, PMOS, PNP, NPN etc., that extract various devices supported by a particular technology. The key idea is to identify all such DRC rules and device extraction commands with the corresponding scope of execution. For example, the DRC Rule 10.015 in the Hercules runset example given above is only valid when the switch "METAL_LAYERS" is "4LM". However, the DRC Rule 10.010 has a global scope of execution.

It is quite common that a single test design may not be sufficient to cover all the rules and device extraction commands. Different test cases may be needed to cover different rules and different parts of the runset. The method of the present invention is able to combine the coverage results of different test cases and generate a cumulative coverage report taking into account all the test cases used in the QA.

Once all the DRC rules and device extraction commands have been identified, the next step is to find out the coverage of these rules and devices. As discussed above, the methodology uses the output summary file that is generated by the backend verification tools like Hercules and Assura to determine the coverage of runsets.

Figure 4:
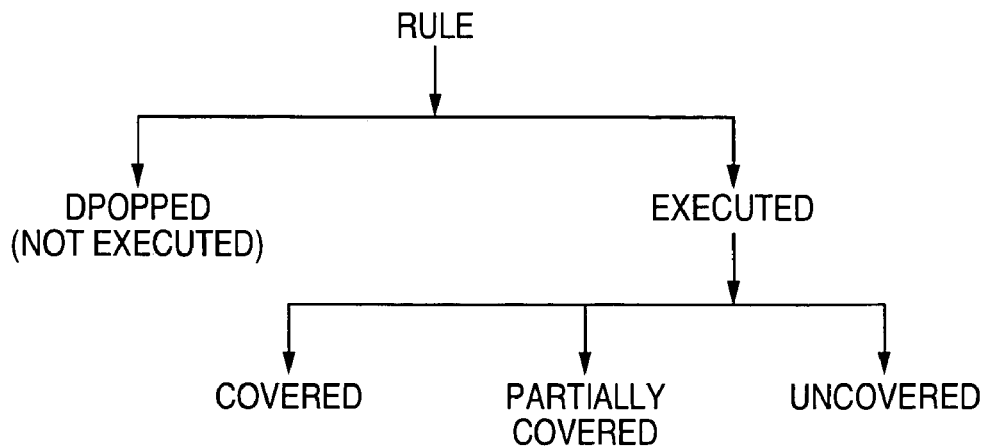
FIG. 4 shows the possible different states of a DRC rule.

As shown in FIG. 4, a rule will either be executed or it will be skipped altogether if the execution control does not fall into the rule scope due to values of some switches. A rule that is skipped during execution is considered to be a "dropped" rule; rules that are actually executed are further classified into "covered", "uncovered" and "partially covered" rules.

The following defines the different states of a rule:

a) DROPPED: Any rule that is not executed during the DRC run is considered as "dropped" rule. Essentially, this means that any rule that is present in the runset file but not present in the output summary file will be considered as dropped.

b) UNCOVERED: A rule is classified as "uncovered" if all the original (primary) layers in the set corresponding to any input layer of the rule are empty.

c) PARTIALLY COVERED: A rule is classified as "partially covered" if one or more derived layers from the immediate inputs of the rule till the primary layers in the directed reference layer graph are empty and/or if none of the sets of primary layers corresponding to each input layer of the rule are completely empty.

d) COVERED: A rule will be classified as "covered" if and only if all the layers from the immediate input of the rule till all the primary layers corresponding to that rule have valid data in the directed layer graph (i.e. all the layers in the reference graph are non-empty).

Note that, if a rule is executed, it does not necessarily mean that the rule is covered. It is important that the layer graph corresponding to the rule must have valid data in all its layers (both primary and derived) for the rule to be classified as covered.

Figure 5:
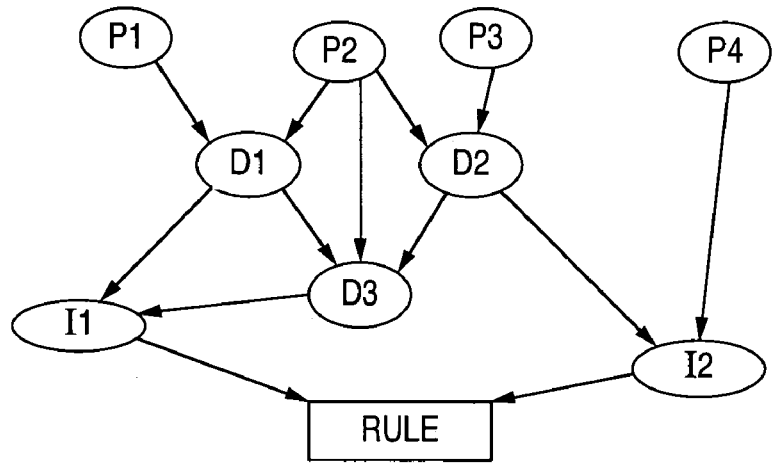
FIG. 5 shows an example of a reference layer graph for a DRC rule.

To illustrate these definitions, reference is made to the reference layer graph for a DRC rule as shown in FIG. 5. In the FIG. 5 reference layer graph, the original primary layers are P1, P2, P3 and P4, the derived (intermediate layers) are D1, D2, D3, I1 and I2, and I1 and I2 are the input layers to the rule.

The following sets are therefore defined: the set of primary layers that derive input layer I1:S1={P1, P2, P3}; the set of primary layers that derive input layer I2:S2={P2, P3, P4}; the set of intermediate derived layers D={D1, D2, D3, I1, I2}.

As per the above definitions, the rule will be reported as covered if all of the layers defined in set S1, S2 and the set D are non-empty, i.e. the layers P1, P2, P3, P4, D1, D2, D3 I1 and I2 are non-empty.

The rule will be reported as uncovered, if all of the primary layers in the set S1 or set S2 or both are empty, i.e. if either P1, P2 and P3 are empty or P2, P3 and P4 are empty or P1, P2, P3 and P4 are empty at the same time.

The rule will be reported as partially covered if at least one primary layer in set S1 and set S2 is non-empty and/or one or more layers in set D are empty.

Figure 6:
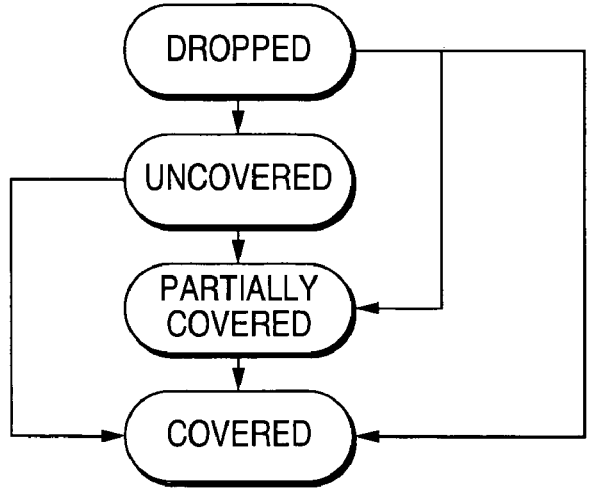
FIG. 6 shows a state diagram of a DRC rule.

A DRC rule can change its state only in the following ways, as shown in the FIG. 6 state diagram. FIG. 6 illustrates that a rule can change its state from the initial dropped state to the final covered state. The dropped state is the source point and the covered state is the sink point. A rule that has been covered in one test case cannot go back to any of the previous states, i.e. a rule that has been covered in one test case; even if skipped in another test case, the rule will be still considered as a covered rule.

Figure 7:
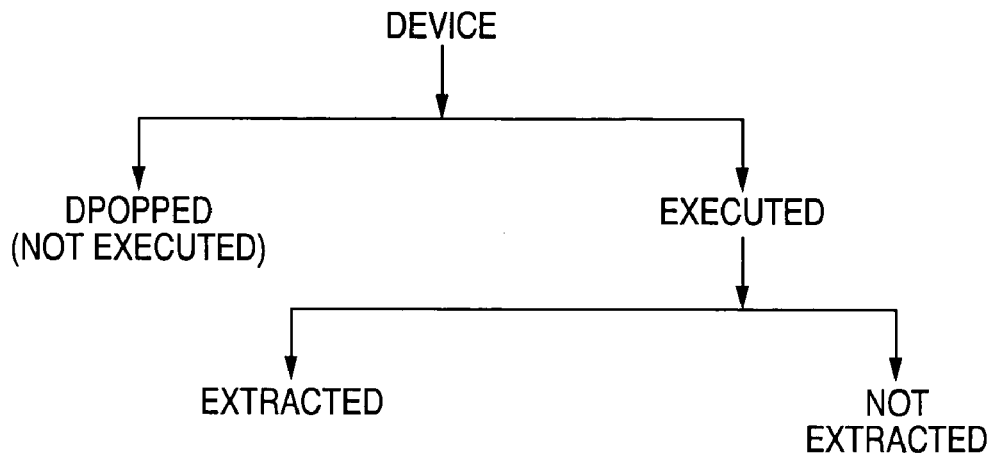
FIG. 7 shows the possible different states of a device.

Having discussed the different states of a rule, FIG. 7 shows the possible states of a device. A device extraction command will either be executed or it will be skipped. A device extraction command that is skipped will be considered as a "dropped" device. The device extraction commands that are actually executed will be further classified as either "extracted" or "not extracted." The fact that a device extraction command is executed does not necessarily mean that the corresponding device will be extracted successfully. Therefore, the device extraction commands for LVS runsets that have been executed will be further classified as "extracted" or "not extracted." For a device to be classified as "extracted", it is necessary that the directed layer graph for the device must have valid data in all its layers.

Figure 8B:
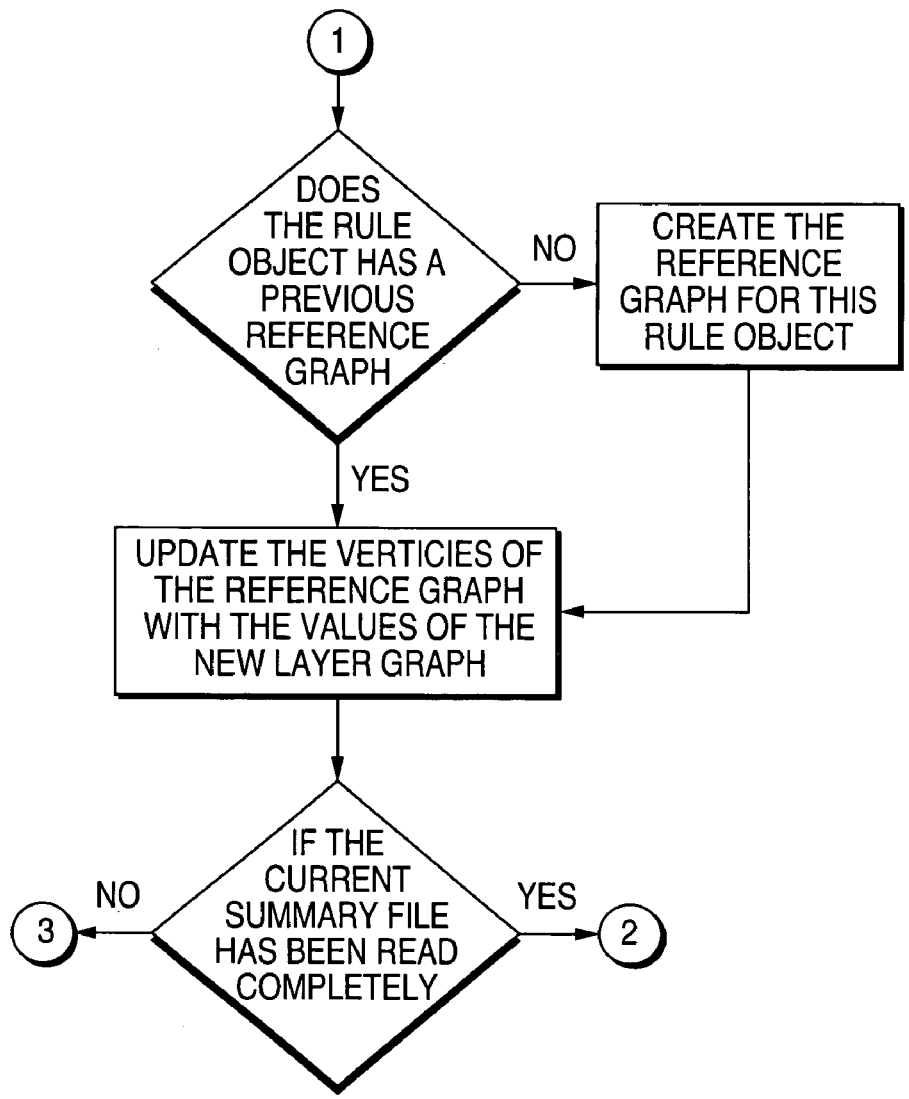
FIGS. 8A and 8B combine to provide a flow chart of a methodology in accordance with the concepts of the present invention.
Figure 8A:
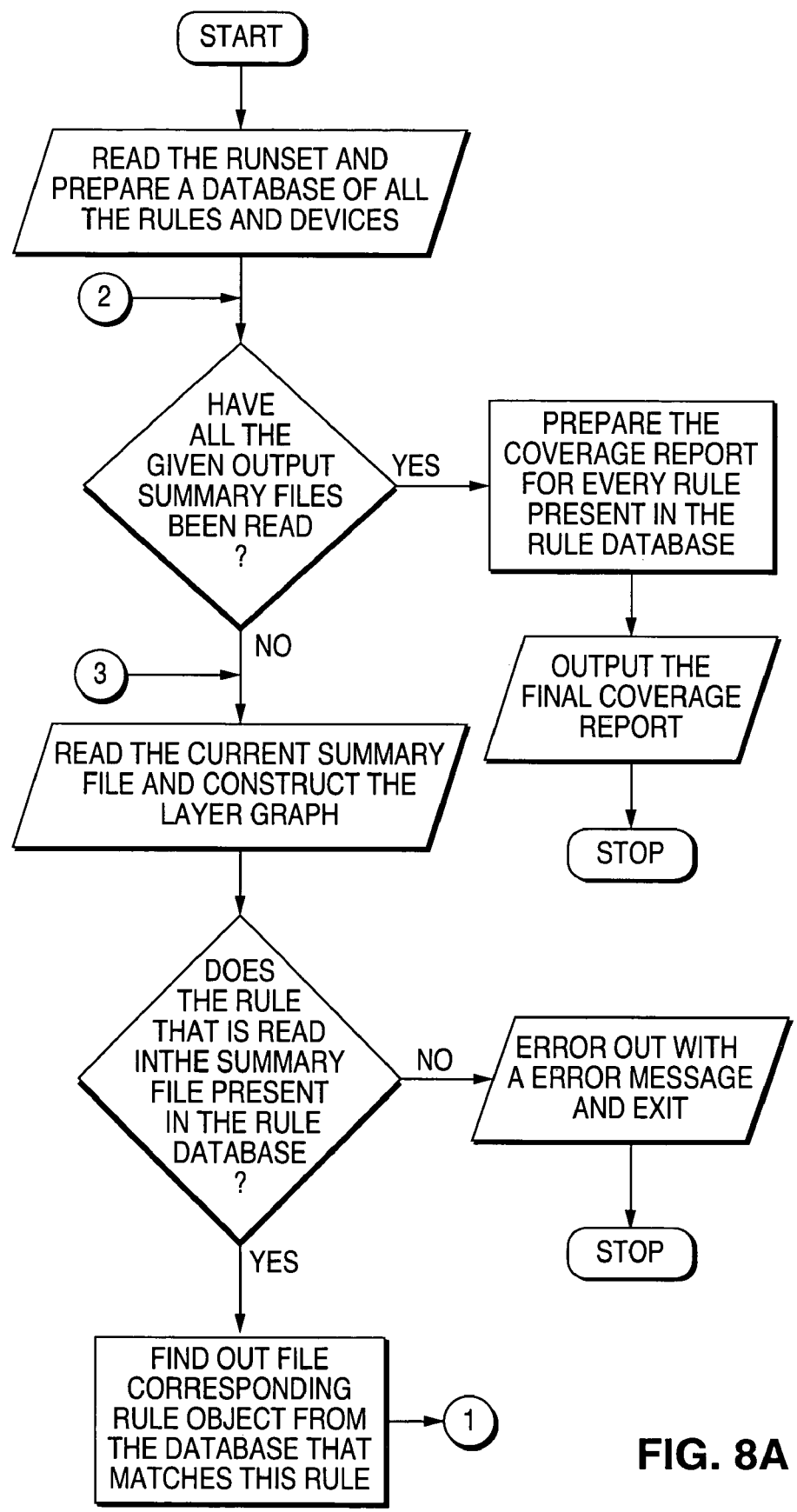

The flowchart that depicts the overview of the algorithm used is provided in FIGS. 8A/8B. The flowchart presents an overview of a methodology in accordance with the present invention.

With reference to FIG. 8A, the method proceeds as follows: Read the DRC/Antenna/LVS runset file and identify all of the design rules and device extraction commands. Then create a database of all the rules and devices that appear in the runset file. Start reading all of the output summary files of different DRC runs for various test designs one by one in the manner described below. Each output summary file corresponds to one test case. For each summary file that is read, start creating the universal layer graph depending on the sequence of the statements and data creation commands that appear in the output summary file. When a DRC rule or a device extraction command appears in the output summary file, determine the exact rule (device) from the original rule database that matches this rule (device). Once the exact rule (device) in the rule database corresponding to the one being read in the summary file has been identified, update the status of the rule (device) using the following method:

Determine if the rule (device) had any previous reference graph. If the rule (device) does not have any previous existing reference graphs, it means that the corresponding rule (device) has been executed for the first time. Copy the portion of the graph from the layer graph that is being constructed which applies to this rule (device) and update this reference graph with the current states of all the layer vertices (whether they are empty or non-empty) that are a part of this graph. The reference graph vertices are updated with the current state of the vertices of the layer graph only if all the input layers to the rule (device) are non-empty in the layer graph. If this condition is not met, then the reference graph is not updated.

If the rule had a previous reference graph, it means that the rule had been executed in some other DRC run of some previous test case. Update this previous existing reference graph with the current state of the vertices of the new graph provided that all the input layers to the rule are non-empty in the new graph. During updating, only the layer vertices that were empty earlier are updated. If a particular vertex (layer) has been already marked before as non-empty, the node is not updated, even though it might be empty in the current test case.

When the reference graph for the rule has been updated, the foregoing steps are repeated for all the rules that appear in that summary file.

Referring to FIG. 8B, after all of the summary files have been read, the rules present in the rules database are classified into the appropriate state as follows: If any rule does not have a reference graph representation, then it means that the rule has not been executed and therefore the rule is classified as dropped. Every rule that is dropped is not executed as the execution control did not reach the scope of execution where that rule is coded. While parsing the runset file, the scope of execution of every rule can be stored. This way, the reason as to why the rule is dropped and what could be done (what values should be given to the environment variables and switches) can be determined so that the execution control passes through the scope of that rule.

Example 1 below represents a portion of the output coverage report generated by the CAD tool (TCA) that has been developed using this method.

Example 1

1. Rule: ENCLOSE ps1 BY mt4 COMMENT="130.00 TOP METAL enclosure of passivation >3.7 for 75 fine Pitch"
RUNSET LINE NUMBER: 4418;
STATE: DROPPED
REASON: One or more following conditions listed below is FALSE
IF(METAL_LAYERS=="4LM")
IF (PASSIVATION_75_PITCH=="TRUE")

This example gives a message that the above rule that appears in the DRC runset at line number 4418 is dropped. It will be executed only if the switch "METAL_LAYERS" is set to "4LM" and the switch "PASSIVATION_75_PITCH" is set to "true". This defines the scope of the execution of this rule. Since, the DRC was not run with these values of these switches, the rule was dropped. The user, therefore, needs to run DRC on a test case with these values of the above two switches to make sure that the rule is not dropped.

If a rule has a reference graph, each layer vertex in the reference graph is traversed starting from the input layers (vertices) of the corresponding rule. During traversal, layers that are empty can be stored in a list. During traversal, if it is found that all the vertices of the reference graph have been marked as non-empty, then the rule is classified as covered.

If the set of all primary layer vertices corresponding to any input layer of the rule are empty, then the rule is classified as uncovered. In such cases, all these empty primary layers are reported in the coverage report.

An example of an uncovered rule is given below:

Example 2:

250. Rule: ENCLOSE hmwell BY gx
COMMENT="37.030 GOX enclosure of HNWELL >5.0"
RUNSET LINE NUMBER: 2178
INPUT LAYERS: hnwell gx
STATE UNCOVERED
REASON: The primary layers listed below are empty all at the same time in one or more of the testcases.
Input layer: hnwell
HNWELL
Input Layer: gx
GOX Example 2 reports that the above rule that appears in the runset at line number 2178 is uncovered because the primary layers "HNWELL" and "GOX" were empty in the original layout database of all the test designs used. The input layer "hnwell" has been derived from the primary layer "HNWELL" and the input layer "gx" has been derived from the primary layer "GOX" and both these primary layers are empty. Using this information, the QA engineer can design a new testcase with these layers and cover this rule.

For a rule that is classified as partially covered, a similar such report is given.

Example 3:

142. BOOLEAN cap_ctm AND va3
COMMENT="Rule 84.170—Top_via_minus_one under CTM as a capacitor top plate is not allowed"
RUNSET LINE NUMBER: 4121;
INPUT LAYERS: cap_ctm va3
STATE: PARTIALLY_COVERED
The following minimal combinations for each layer are still required to make this rule totally covered.
Input Layer: cap_ctm
(CTM VI4)
Input Layer: va3
The following derived layers are empty for this input layer.
Vai3 (DERIVED LAYER)
Va 3 (DERIVED LAYER).

Example 3 reports that the rule that appears at line number 4121 in the runset file is partially covered. It essentially means that some vertices in the reference layer graph of this rule were empty and some were marked as non-empty. It also means that one of the primary layers CTM or VI4 is empty but both are not empty. (If this would have been the case, then the rule would have been classified as uncovered). Therefore, in order to cover this rule fully, the QA engineer must provide a test case in which both the primary layers "CTM" and "VI4" (both these layers are needed for the input layer "cap ctm") are present simultaneously and at the same time, the derived layer "vai3" and "va3" (layers with reference to the input layer "va3") are also non-empty. Similar such information can be provided for all the devices of an LVS runset that could not be extracted by different test cases. For all the devices that could not be extracted, it is possible to report which original layers were missing for these devices in the test cases. The QA engineer can design new test cases based on this information to make sure that every device extraction command is covered.

In conclusion, a methodology is provided that can be used to quantitatively measure the coverage of backend verification runsets for DRC and LVS. This approach helps the QA engineers determine the quality of the test designs used in the QA of the runsets. It also suggests ways to develop new test cases to achieve 100% coverage of the runsets. This ensures that the runsets that are released to the product lines are of the best quality. Meeting the highest quality standard of the runsets reduces the cycle time and enhances the chance of achieving first time functioning silicon.

The concepts described in this document can be extended to determine the coverage of various other types of runsets present in the design package.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A method of measuring test coverage of backend verification runsets, the method comprising:
   reading a runset;
   preparing a database of all rules and devices identified in reading the runset;
   determining whether output summary files of the runset have been read;
   if all of the output summary files have been read, preparing a coverage report for every rule present in the rule database and outputting a final coverage report;

if all of the output summary files have not been read, reading a current summary file and constructing a corresponding layer graph as follows:

determining if a rule that is read in the current summary file is present in the rule database;

if the rule is not in the rule database, providing an error message;

if the rule is in the rule database, determining a corresponding exact rule from the rule database;

determining whether the exact rule has a previous reference graph;

if the exact rule does not have a previous reference graph, creating a reference graph for the exact rule;

if the exact rule does have a previous reference graph, updating the vertices of the reference graph with a value of the corresponding layer graph;

if the current summary file has been read completely, returning to the above step of determining whether all of the output summary files have been read and proceeding with the subsequent steps of the method; and if the current summary file has not been read completely, returning to the above step of reading the current summary file and constructing the corresponding layer graph and proceeding with the subsequent steps of the method.

2. A machine-readable medium having stored thereon sequences of instructions for implementing a method of measuring test coverage of backend verification runsets, the instruction sequences including instructions that, when executed by a data processing system, cause the data processing system to perform:

reading a runset;

preparing a database of all rules and devices identified in reading the runset;

determining whether output summary files of the runset have been read;

if all of the output summary files have been read, preparing a coverage report for every rule present in the rule database and outputting a final coverage report;

if all of the output summary files have not been read, reading a current summary file and constructing a corresponding layer graph as follows:

determining if a rule that is read in the current summary file is present in the rule database;

if the rule is not present in the rule database, providing an error message;

if the rule is present in the rule database, determining a corresponding exact rule from the rule database;

determining whether the exact rule has previous reference graph;

if the exact rule does not have a previous reference graph, creating a reference graph for exact rule object;

if the exact rule does have a previous reference graph, updating the vertices of the reference graph with a value of the corresponding layer graph;

if the current summary file has been read completely, returning to the above step of determining whether all of the output summary files have been read and proceeding with the subsequent steps; and if the current summary file has not been read completely, returning to the above step of reading the current summary file and constructing the corresponding layer graph and proceeding with the subsequent steps.

* * * * *

UNITED STATES PATENT AND TRADEMARK OFFICE
CERTIFICATE OF CORRECTION

| | |
|---|---|
| PATENT NO. | : 7,254,791 B1 |
| APPLICATION NO. | : 11/229085 |
| DATED | : August 7, 2007 |
| INVENTOR(S) | : Himanshu Agrawal, Partha Ray and Tathagato Rai Dastidar |

It is certified that error appears in the above-identified patent and that said Letters Patent is hereby corrected as shown below:

In Column 12, line 20, change "exact rule object." to --exact rule.--

Signed and Sealed this

Twenty-third Day of October, 2007

JON W. DUDAS
*Director of the United States Patent and Trademark Office*